(12) United States Patent
Tsukagoshi

(10) Patent No.: US 11,069,824 B2
(45) Date of Patent: Jul. 20, 2021

(54) OPTICAL SENSOR DEVICE AND METHOD OF MANUFACTURING THE SAME

(71) Applicant: ABLIC Inc., Chiba (JP)

(72) Inventor: Koji Tsukagoshi, Chiba (JP)

(73) Assignee: ABLIC INC., Chiba (JP)

(*) Notice: Subject to any disclaimer, the term of this patent is extended or adjusted under 35 U.S.C. 154(b) by 10 days.

(21) Appl. No.: 16/778,531

(22) Filed: Jan. 31, 2020

(65) Prior Publication Data

US 2020/0259023 A1 Aug. 13, 2020

(30) Foreign Application Priority Data

Feb. 12, 2019 (JP) .............................. JP2019-022256

(51) Int. Cl.
*H01L 31/0203* (2014.01)
*H01L 31/18* (2006.01)

(52) U.S. Cl.
CPC .......... *H01L 31/0203* (2013.01); *H01L 31/18* (2013.01)

(58) Field of Classification Search
CPC .......... H01L 31/0203; H01L 31/02005; H01L 23/02; H01L 51/448; H01L 31/02002
See application file for complete search history.

(56) References Cited

U.S. PATENT DOCUMENTS

| | | | | |
|---|---|---|---|---|
| 5,064,782 A | * | 11/1991 | Nishiguchi | H01L 23/10 228/121 |
| 5,783,464 A | * | 7/1998 | Burns | H01L 21/50 438/112 |
| 5,956,576 A | * | 9/1999 | Toy | H01L 23/10 438/125 |
| 5,998,862 A | * | 12/1999 | Yamanaka | H01L 27/14618 257/704 |
| 6,057,597 A | * | 5/2000 | Farnworth | H01L 23/04 257/698 |
| 6,130,448 A | * | 10/2000 | Bauer | H04N 5/2254 257/222 |
| 6,388,264 B1 | * | 5/2002 | Pace | H01L 25/167 250/239 |
| 6,483,179 B2 | * | 11/2002 | Iizima | H01L 27/14618 257/666 |
| 6,759,266 B1 | * | 7/2004 | Hoffman | H01L 27/14683 438/64 |
| 6,897,428 B2 | * | 5/2005 | Minamio | H01L 27/14601 250/208.1 |
| 7,247,509 B2 | * | 7/2007 | Yamauchi | H01L 24/97 257/E33.058 |

(Continued)

FOREIGN PATENT DOCUMENTS

JP 2006-041143 A 2/2006
JP 2009-200222 A 9/2009

*Primary Examiner* — Earl N Taylor
(74) *Attorney, Agent, or Firm* — Brinks Gilson & Lione

(57) ABSTRACT

An optical sensor device has an optical semiconductor element fixed into a recessed portion of a base portion, and a pad portion of the optical semiconductor element is electrically connected to a lead portion of the base portion. On an upper surface of a protruding portion provided in an outer region of the base portion, a metallization layer having notch portions, a metal bonding layer, a metallization layer having notch portions, and a lid portion are provided. Through use of the metallization layers and the metal bonding layer, the lid portion can be hermetically bonded to the base portion.

16 Claims, 9 Drawing Sheets

(56) References Cited

U.S. PATENT DOCUMENTS

| | | | | |
|---|---|---|---|---|
| 7,265,340 | B2* | 9/2007 | Minamio | H01S 5/02208 |
| | | | | 250/239 |
| 7,273,765 | B2* | 9/2007 | Minamio | H01L 27/14618 |
| | | | | 257/E21.599 |
| 8,785,839 | B2* | 7/2014 | Takeuchi | G01J 1/0488 |
| | | | | 250/239 |
| 2003/0116817 | A1* | 6/2003 | Yeh | H01L 31/0203 |
| | | | | 257/444 |
| 2004/0020676 | A1* | 2/2004 | Stark | H01L 21/50 |
| | | | | 174/539 |
| 2004/0104460 | A1* | 6/2004 | Stark | H01L 23/10 |
| | | | | 257/678 |
| 2005/0001219 | A1* | 1/2005 | Minamio | H01L 31/0203 |
| | | | | 257/79 |
| 2005/0013562 | A1* | 1/2005 | Tatehata | H01L 31/02325 |
| | | | | 385/93 |
| 2007/0284714 | A1* | 12/2007 | Sakakibara | H01L 23/055 |
| | | | | 257/680 |
| 2009/0014867 | A1* | 1/2009 | Krawiec | H01L 23/047 |
| | | | | 257/728 |
| 2009/0032924 | A1* | 2/2009 | Stark | H01L 27/14685 |
| | | | | 257/680 |
| 2012/0248298 | A1* | 10/2012 | Takeuchi | G01J 5/045 |
| | | | | 250/226 |
| 2015/0221783 | A1* | 8/2015 | Tsukagoshi | H01L 31/02325 |
| | | | | 257/432 |
| 2020/0259023 | A1* | 8/2020 | Tsukagoshi | H01L 31/0203 |

* cited by examiner

OPTICAL SENSOR DEVICE AND METHOD OF MANUFACTURING THE SAME

RELATED APPLICATIONS

This application claims priority to Japanese Patent Application No. 2019-022256 filed on Feb. 12, 2019, the entire content of which is incorporated herein by reference.

BACKGROUND OF THE INVENTION

1. Field of the Invention

The present invention relates to an optical sensor device and a method of manufacturing the optical sensor device.

2. Description of the Related Art

Ultraviolet rays are included, for example, in sunlight and in emission from an ultraviolet emission source such as an excimer lamp or an LED, and there is a concern about a negative effect of the ultraviolet rays on human bodies. Meanwhile, ultraviolet rays are increasingly used in industrial equipment and other applications such as uses for resin curing and an excitation light source for lighting, and also constitutes a wavelength band which draws attention. Characteristics, such as wavelength and power, of ultraviolet rays included in sunlight or emitted from a light emission source can easily be detected through utilization of an ultraviolet sensor produced through use of a semiconductor element and an assembly process that are relatively inexpensive and highly reliable.

In Japanese Patent Application Laid-open No. 2009-200222, there is described an ultraviolet sensor housed in a hermetically sealed package in which a window member made of quartz glass or sapphire is attached to a cylindrical cap made of metal, and a sensor chip is mounted inside the housing. Even though the ultraviolet sensor can detect light entering from immediately above the sensor chip, its acceptance angle is, however, narrow, and hence detection of light tends to be limited within a restricted range, resulting in a narrow light reception range. In Japanese Patent Application Laid-open No. 2006-41143, there is described an optical semiconductor device adopting a structure in which a transparent lid is brought close to a sensor chip, instead of a cylindrical cap made of metal which blocks incident light, to thereby enable reception of incident light at a wide angle.

However, in the invention described in Japanese Patent Application Laid-open No. 2006-41143, since the sealing body in which the optical semiconductor element is housed is bonded to the transparent lid with an epoxy-based adhesive, the adhesive deteriorates by a long-time radiation of ultraviolet rays, causing separation of the sealing body and the transparent lid, and loss of the reliability of the device.

SUMMARY OF THE INVENTION

It is an object of the present invention to provide a highly reliable optical sensor device housed in a highly airtight hollow package.

According to at least one embodiment of the present invention an optical sensor device includes a base portion; an optical semiconductor element placed on the base portion; a lid portion stacked onto the base portion, the lid portion sealing the optical semiconductor element in a hollow portion; a first metallization layer formed on a surface of the lid portion opposing the base portion; a second metallization layer formed on a surface of the base portion opposing the lid portion; and a bonding layer bonding the first metallization layer to the second metallization layer, the first metallization layer having a plurality of first notch portions.

Further, according to at least one embodiment of the present invention a method of manufacturing an optical sensor device includes preparing a base portion and a lid portion stackable onto the base portion; forming a first metallization layer on a surface of the lid portion opposing the base portion; forming a second metallization layer on a surface of the base portion opposing the lid portion; placing the optical semiconductor element onto the base portion; applying a metal bonding material onto the first metallization layer; pre-baking the applied metal bonding material; stacking the lid portion and the base portion through intermediation of the first metallization layer, the second metallization layer, and the pre-baked metal bonding material; and final-baking the lid portion and the base portion at a temperature higher than a temperature in the pre-baking of the applied metal bonding material while applying weight to one of the lid portion and the base portion to bond the lid portion to the base portion.

Through use of the above-mentioned measures, it is possible to provide a highly reliable optical sensor device housed in a highly airtight hollow package.

DETAILED DESCRIPTION OF THE PREFERRED EMBODIMENTS

Embodiment of the present invention are described with reference to the drawings. The present invention is not limited to the following embodiments, and it is to be understood that various modifications can be made thereto without departing from the gist of the present invention.

Figure 1:
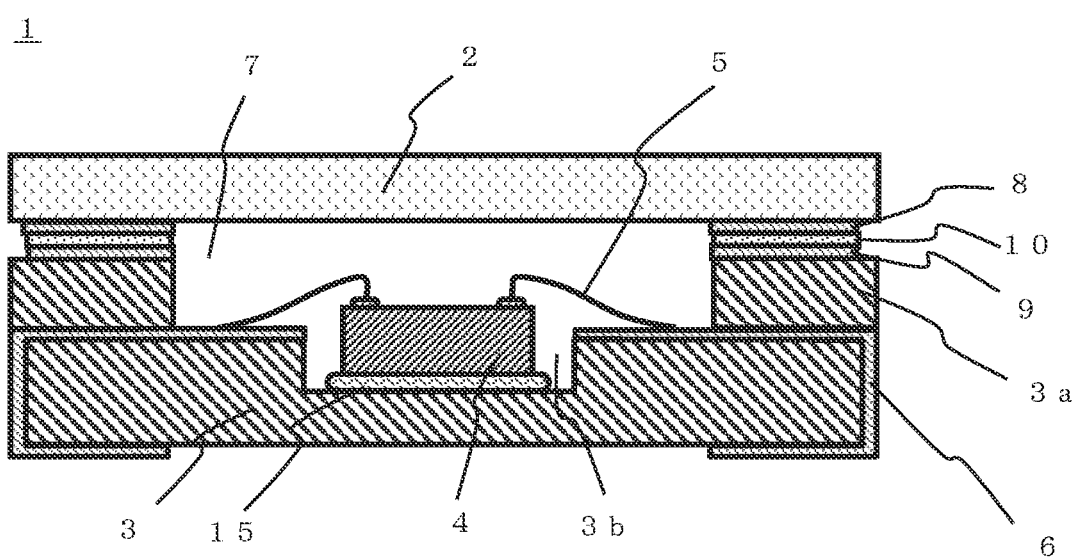
FIG. 1 is a cross-sectional view of an optical sensor device according to a first embodiment of the present invention.

FIG. 1 is a cross-sectional view of an optical sensor device according to the first embodiment of the present invention. An optical semiconductor element 4 is fixed to a bottom surface of a recessed portion 3b of a base portion 3 through the intermediation of a die bonding layer 15, and a pad portion on a surface of the optical semiconductor element 4 and a lead portion 6 formed on a surface of the base portion 3 are electrically connected by a wire 5. Further, an entire periphery of an outer region of the base portion 3 is formed as a protruding portion 3a having a shape that protrudes upward. A metallization layer 9 is formed on an upper surface of the protruding portion 3a. A metal bonding layer 10 is formed on an upper surface of the metallization layer 9. A metallization layer 8 is formed on an upper surface of the metal bonding layer 10. A lid portion 2 is provided on an upper surface of the metallization layer 8. Through use of the metallization layers 8 and 9 and the metal bonding layer 10 made of metal which do not deteriorate from ultraviolet rays, the lid portion 2 and the base portion 3 can be hermetically bonded together. Further, a space inside the lid portion 2 and the base portion 3, that is, a space in which the optical semiconductor element 4 is housed, serves as a hollow portion 7.

Next, a material of each portion of the optical sensor device 1 is described. The lid portion 2 is formed of a transparent plate made of quartz glass, borosilicate glass, or sapphire and the like and can transmit ultraviolet rays having a wavelength of 200 nm or less at a high transmittance. The base portion 3 is made of a ceramic material, such as alumina or aluminum nitride, and has a satisfactory thermal conductivity. The metallization layers 8 and 9 are each a laminated film of a Ni film and an Au film, and each of the lid portion 2 and the protruding portion 3a of the base portion 3 is in contact with the Ni film, and the Au film is in contact with the metal bonding layer 10. The metal bonding layer 10 is made of solder or gold-tin alloy and the like, and SnAgCu, SnAg, SnCu, SnNi, or AuSn and the like may be used as constituent. As described above, materials that do not deteriorate by the ultraviolet rays are used for the lid portion 2, the base portion 3, the metallization layers 8 and 9, and the metal bonding layer 10. However, the inventor of the present invention found in his researches that, in this configuration, since a portion at which the lid portion 2 and the metallization layer 8 are bonded is the weakest and stress tends to be applied to this portion, peeling is liable to occur from this portion.

Figure 2A:
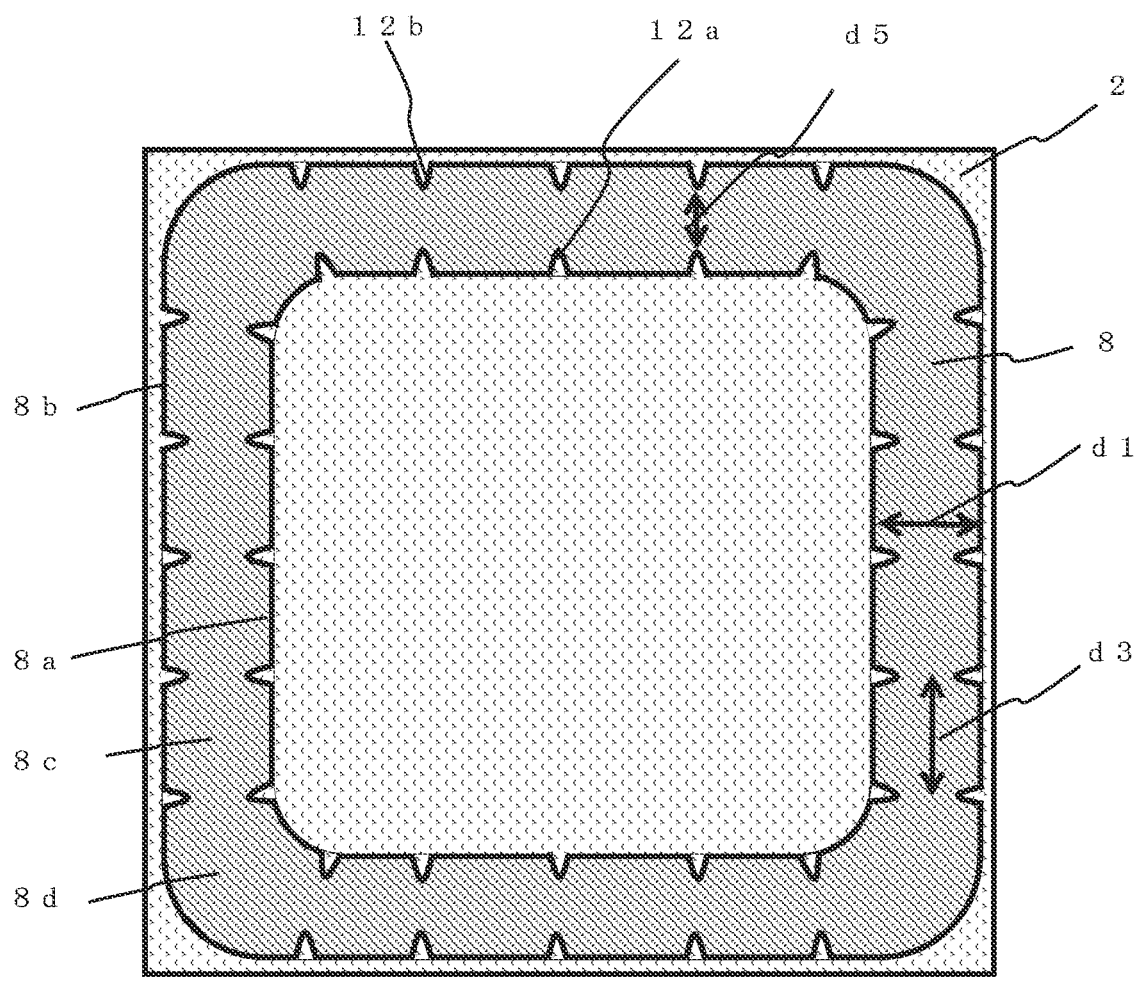
FIG. 2A and FIG. 2B are a plan view and a cross-sectional view of a lid portion of the optical sensor device according to the first embodiment of the present invention, respectively.
Figure 2B:
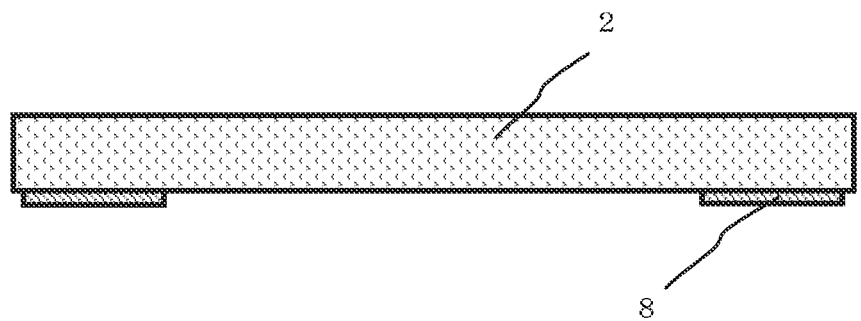

In view of this, measures illustrated in FIGS. 2A to 3B are taken. FIG. 2A and FIG. 2B are a plan view and a cross-sectional view of the lid portion of the optical sensor device according to a modified example of the first embodiment of the present invention, respectively. The metallization layer 8 having a width d1 is formed along an entire periphery of the lid portion 2, and the metallization layer 8 has a square ring shape with rounded corners formed in a region between an inner circumference 8a and an outer circumference 8b which is located on an inner side with respect to an end of the lid portion 2. Further, a notch portion 12a having a wedge shape is formed from the inner circumference 8a toward the outside, and a notch portion 12b having a wedge shape is formed from the outer circumference 8b toward the inside.

The notch portion 12a is arranged to oppose the notch portion 12b along the straight line perpendicular to the center line, which has also a square ring shape, of the metallization layer 8 in its widthwise direction. Further, the end of the notch portions 12a faces and is separated from the end of the notch portion 12b while keeping an end-to-end distance d5 in which the sum of lengths of the notch portions 12a and 12b should be equal to or larger than $1/10$ of the width d1.

The metallization layer 8 is constituted from a straight portion 8c and a curved portion 8d. However, the notch portions 12a and 12b are not formed in the curved portion 8d but formed only in the straight portion 8c at an equal interval d3 in a lengthwise direction of the metallization layer 8. Further, not shown though, when the metal bonding layer 10 is formed on the metallization layer 8, the metal bonding layer 10 wets the metallization layer 8 and spreads, and hence the metal bonding layer 10 and the metallization layer 8 exhibit substantially the same shape in plan view.

In the absence of the notch portions 12a and 12b, the following failure may occur. Specifically, a large stress concentrates at one position of the metallization layer 8 at which peeling of the lid portion 2 and the metallization layer 8 occurs. In contrast, in the presence of the notch portions 12a and 12b, the stress due to the bonding of the lid portion 2 and the base portion 3 is dispersed into regions sectioned by the notch portions 12a and 12b, and no longer concentrates at one position. In this manner, the failure in which the lid portion 2 peels from and the metallization layer 8 can be prevented.

The notch portions 12a and 12b each having a wedge shape are illustrated in FIG. 2A though, the notch portions 12a and 12b each having an arc shape or a rectangular shape may also be employed instead of the notch portions 12a and 12b each having a wedge shape. Further, the metallization layer 8 should not be divided in its widthwise direction, and an opening region without the metallization layer 8 may be additionally formed between the ends of the notch portions 12a and 12b.

The modified example in which the notch portion 12a formed on the inner circumference 8a of the metallization layer 8 faces the notch portion 12b formed on the outer circumference 8b of the metallization layer 8 is described above. Since stress can be dispersed by partially reducing the width of the metallization layer 8 in that case, the notch portion 12a and the notch portion 12b may be arranged in a staggered pattern. As another example, a notch portion may be arranged on only one of the inner circumference 8a and the outer circumference 8b of the metallization layer 8. When the notch portion does not face another notch portion, the notch portion should have a length equal to or longer than $1/10$ of the width of the metallization layer 8.

Figure 3A:
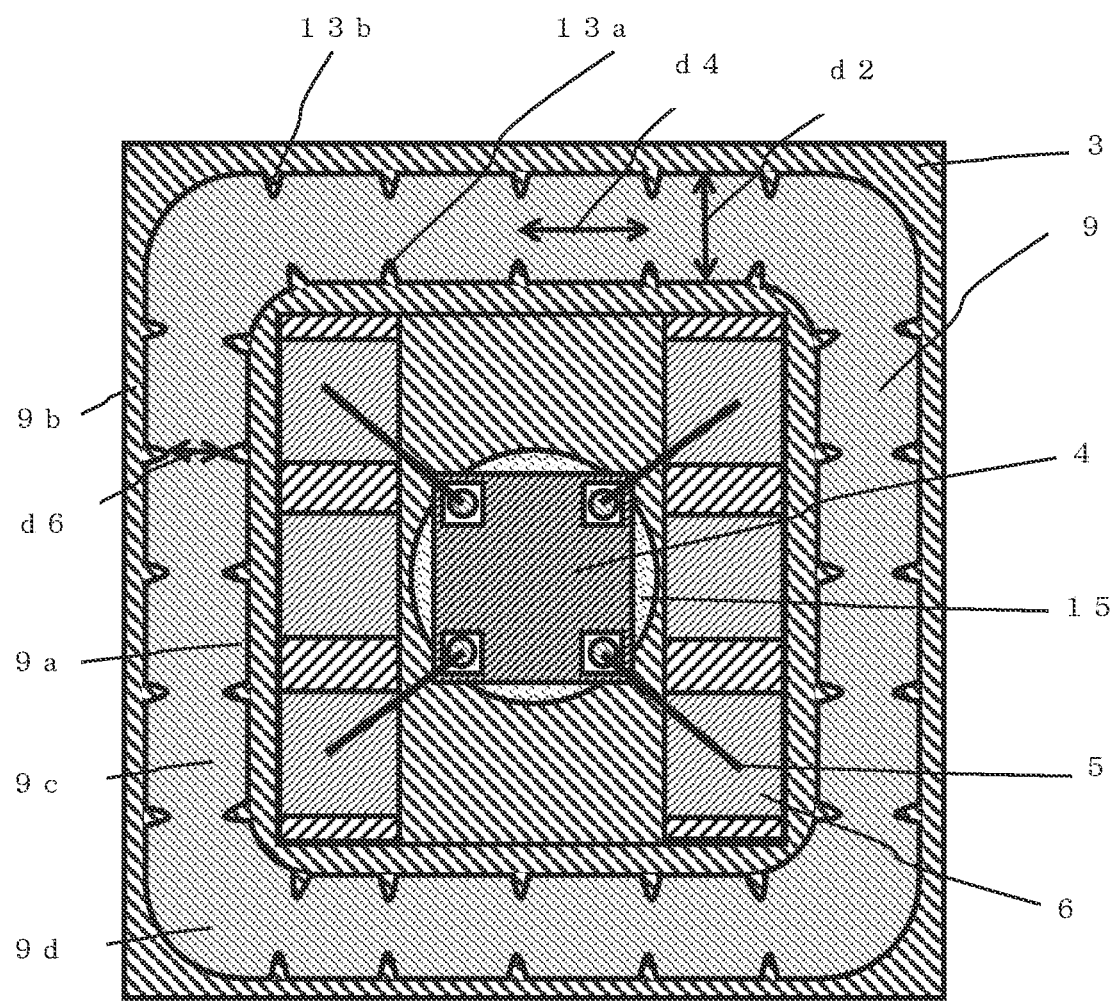
FIG. 3A and FIG. 3B are a plan view and a cross-sectional view of a base portion of the optical sensor device according to the first embodiment of the present invention, respectively.
Figure 3B:
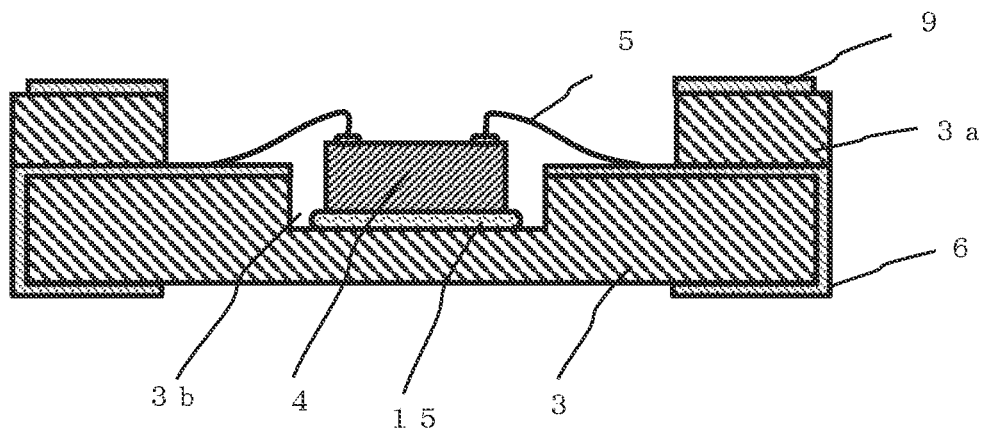

FIG. 3A and FIG. 3B are a plan view and a cross-sectional view of the base portion of the optical sensor device according to the modified example of the first embodiment of the present invention, respectively. The metallization layer 9 is formed along an entire periphery of the base portion 3, and the metallization layer 9 has a square ring shape with rounded corners formed in a region between an inner circumference 9a and an outer circumference 9b which is located on an inner side with respect to an end of the base portion 3. Further, a notch portion 13a having a wedge shape are formed from the inner circumference 9a toward the outside, and a notch portion 13b having a wedge shape are formed from the outer circumference 9b toward the inside.

The notch portion 13a is arranged to oppose the notch portion 13b along the straight line perpendicular to the center line, which has also a square ring shape, of the metallization layer 9 in its widthwise direction. Further, the end of the notch portion 13a faces and is separated from the end of the notch portion 13b while keeping an end-to-end distance d6 in which the sum of lengths of the notch portions 13a and 13b should be equal to or larger than 1/10 of the width d2 of the metallization layer 9.

The metallization layer 9 is constituted from a straight portion 9c and a curved portion 9d. However, the notch portions 13a and 13b are not formed in the curved portion 9d, but formed only in the straight portion 9c at an equal interval d4 in a lengthwise direction of the metallization layer 9 having the width d2. Bonding of the base portion 3 and the metallization layer 9 is more satisfactory than the bonding of the lid portion 2 and the metallization layer 8. In the presence of the notch portions 13a and 13b, stress due to the bonding of the lid portion 2 and the base portion 3 is dispersed into regions sectioned by the notch portions 13a and 13b, and hence bonding property between the base portion 3 and the metallization layer 9 can be improved. Further, when the base portion 3 is bonded to the lid portion 2, position of the notch portions 13a and 13b formed in the metallization layer 9 of the base portion 3 overlap position of the notch portions 12a and 12b formed in the metallization layer 8 of the lid portion 2 in plan view. This configuration effectively prevents peeling of the lid portion 2 from the metallization layer 8.

The notch portions 13a and 13b each having a wedge shape are illustrated in FIG. 3A though, the notch portions 13a and 13b each having an arc shape or a rectangular shape may also be employed instead of the notch portions 13a and 13b each having a wedge shape. Further, the metallization layer 9 should not be divided in its widthwise direction, and an opening region without the metallization layer 9 may be additionally formed between the ends of the notch portions 13a and 13b.

The modified example in which the notch portion 13a formed on the inner circumference 9a of the metallization layer 9 faces the notch portion 13b formed on the outer circumference 9b of the metallization layer 9 is described above. Since stress can be dispersed by partially reducing the width of the metallization layer 9 in that case, the notch portion 13a and the notch portion 13b may be arranged in a staggered pattern. As another example, notch portions may be arranged on only one of the inner circumference 9a and the outer circumference 9b of the metallization layer 9. When the notch portion does not face another notch portion, each notch portion should have a length equal to or longer than 1/10 of the width of the metallization layer 9.

FIG. 4 to FIG. 10 are views for illustrating processes of manufacturing the optical sensor device according to the first embodiment of the present invention.

Figure 4:
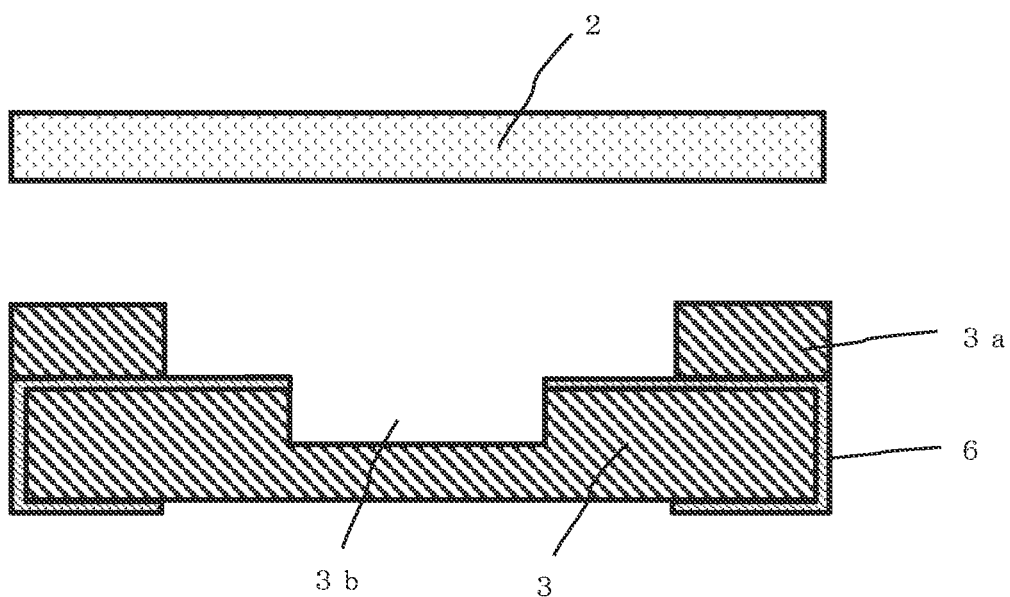
FIG. 4 is a view for illustrating a manufacturing process of the optical sensor device according to the first embodiment of the present invention.

First, as illustrated in FIG. 4, the base portion 3 which is made from ceramic material such as alumina or aluminum nitride and has the recessed portion 3b around the center in its upper portion is prepared. Further, the lid portion formed of a transparent board made of quartz glass, borosilicate glass, or sapphire and the like, is prepared. The lid portion 2 is a flat plate whose front and back surfaces are both smooth. (Process 1)

Figure 5A:
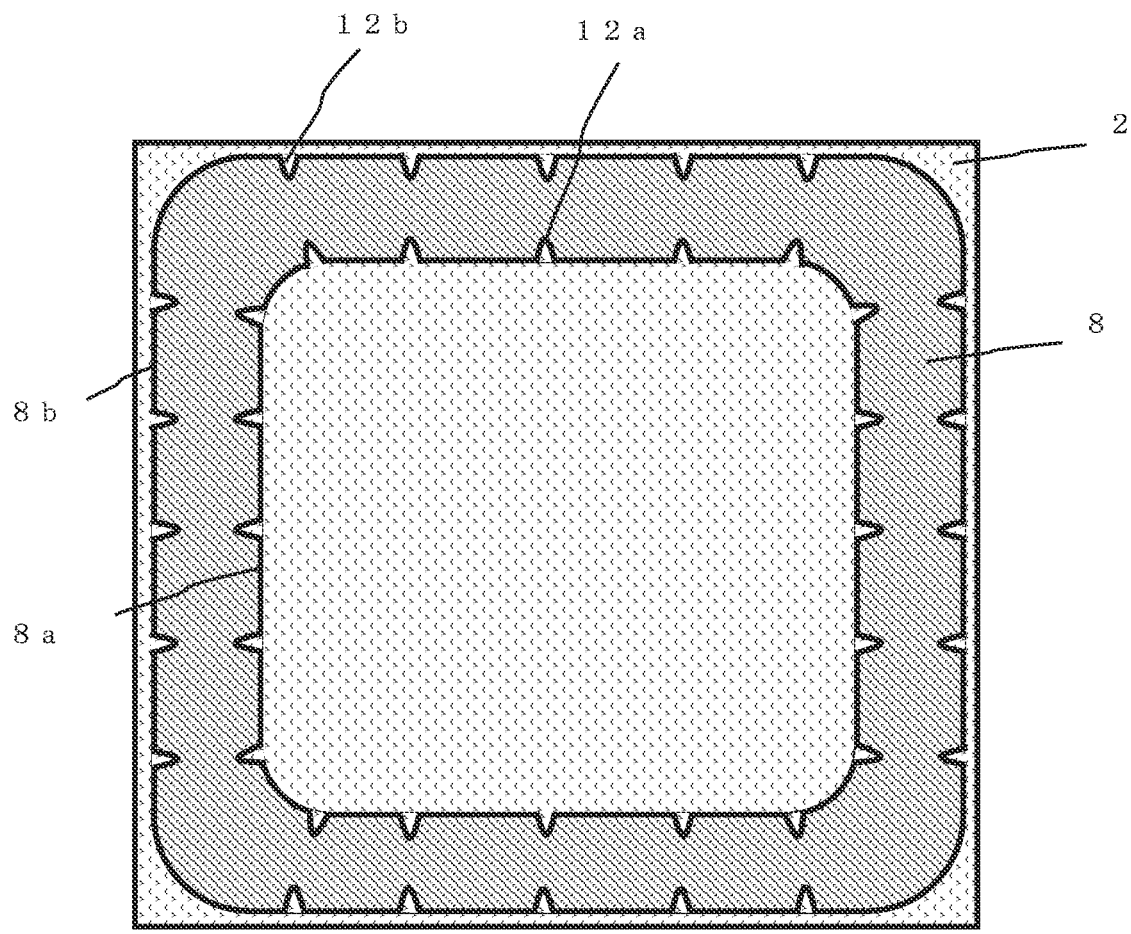
FIG. 5A and FIG. 5B are views following FIG. 4, for illustrating a manufacturing process of the optical sensor device according to the first embodiment of the present invention.
Figure 5B:
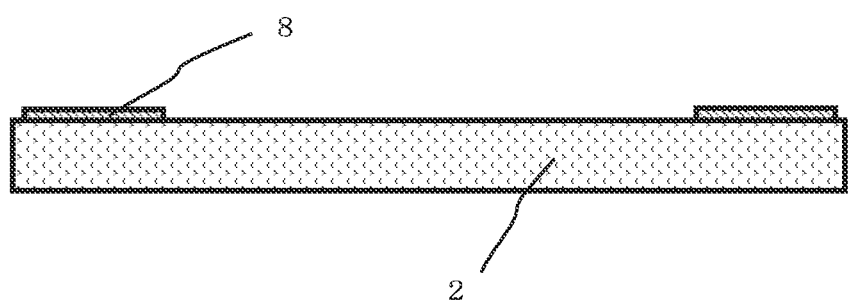

Next, as illustrated in FIG. 5A and FIG. 5B, the metallization layer 8, in which the Ni film and the Au film are laminated in the stated order, is formed on one of principal surfaces of the lid portion 2. The metallization layer 8 has the notch portions 12a on the inner circumference 8a and the notch portions 12b on the outer circumference 8b, and is formed so as to surround an outer region of the lid portion 2. As a method of forming the metallization layer 8, a method in which patterning is carried out simultaneously with the formation of the metallization layer 8 through use of a metal mask, a method in which patterning is carried out after the formation of the metallization layer 8 through use of a resist mask, a lift-off method, or other such method may be appropriately selected. When a plurality of lid portions 2 is prepared in a form of a wafer in Process 1 instead of separated lid portions 2, the plurality of lid portions 2 in the wafer is cut and separated into a desired package size after the metallization layer 8 is formed. Incidentally, the principal surface on which the metallization layer 8 is formed becomes a surface opposing to the base portion 3 later. (Process 2)

Figure 6A:
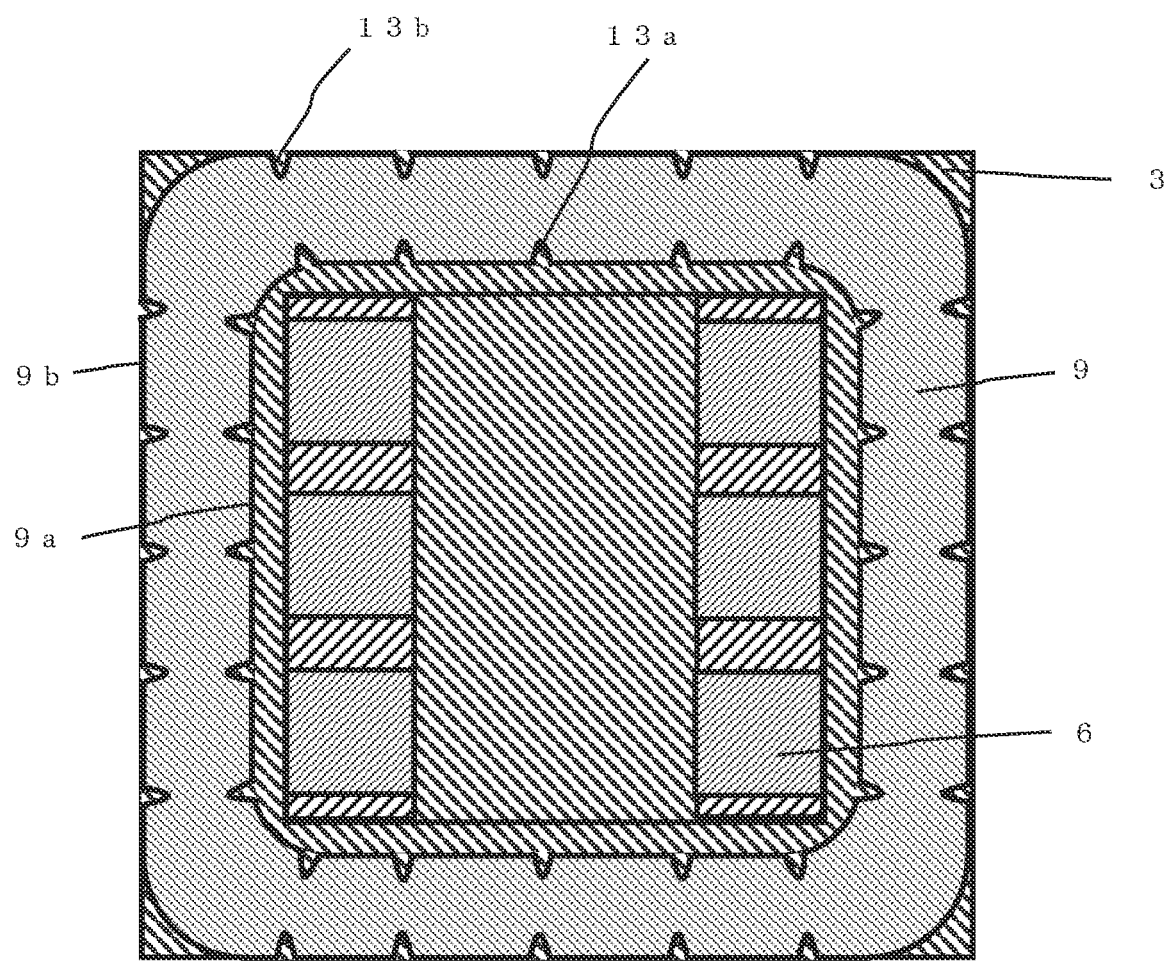
FIG. 6A and FIG. 6B are views following FIG. 5A and FIG. 5B, for illustrating a manufacturing process of the optical sensor device according to the first embodiment of the present invention.
Figure 6B:
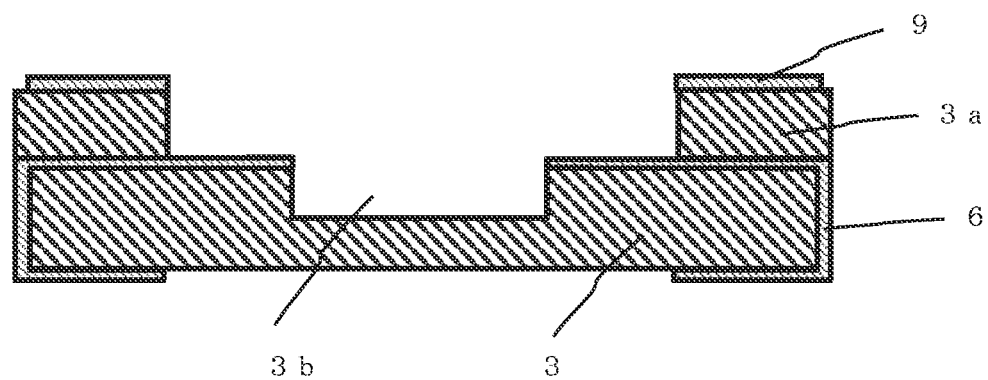

Next, as illustrated in FIG. 6A and FIG. 6B, the Ni film and the Au film are laminated in the stated order onto the surface of the protruding portion 3a provided in the outer region of the base portion 3, to form the metallization layer 9. The metallization layer 9 has the notch portions 13a on the inner circumference 9a and the notch portions 13b on the outer circumference 9b. As a method of forming the metallization layer 9, a method in which patterning is carried out simultaneously with the formation of the metallization layer 9 through use of a metal mask, a method in which patterning is carried out after the formation of the metallization layer 9 through use of a resist mask, a lift-off method, or other such method may be appropriately selected. Incidentally, the surface of the protruding portion 3a on which the metallization layer 9 is formed becomes a surface opposing to the lid portion 2 later. (Process 3)

Figure 7:
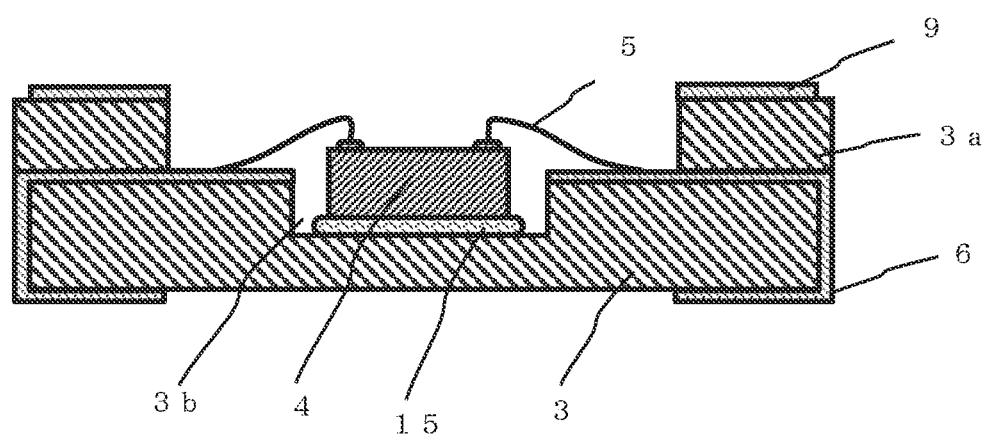
FIG. 7 is a view following FIG. 6A and FIG. 6B, for illustrating a manufacturing process of the optical sensor device according to the first embodiment of the present invention.

Next, as illustrated in FIG. 7, the optical semiconductor element 4 is placed on the bottom surface of the recessed portion 3b of the base portion 3 through the intermediation of the die bonding layer 15 made of silver paste or insulating paste and the like. Then, the pad portion formed on the surface of the optical semiconductor element 4 is electrically connected to the lead portion 6 formed on the surface of the base portion 3 by the wire 5. (Process 4)

Figure 8A:
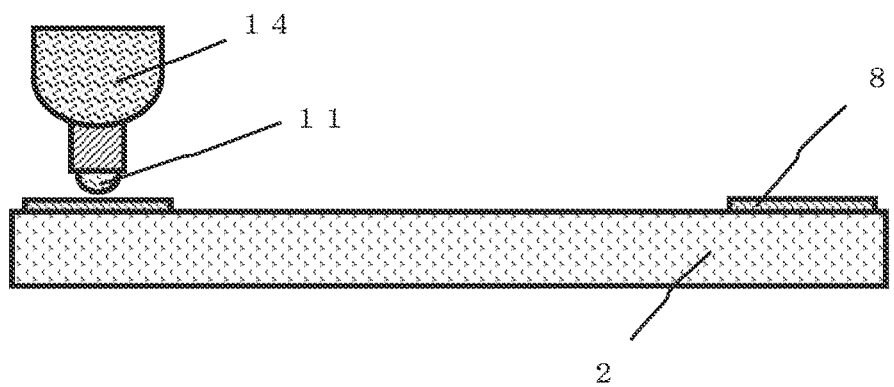
FIG. 8A and FIG. 8B are views following FIG. 7, for illustrating a manufacturing process of the optical sensor device according to the first embodiment of the present invention.
Figure 8B:
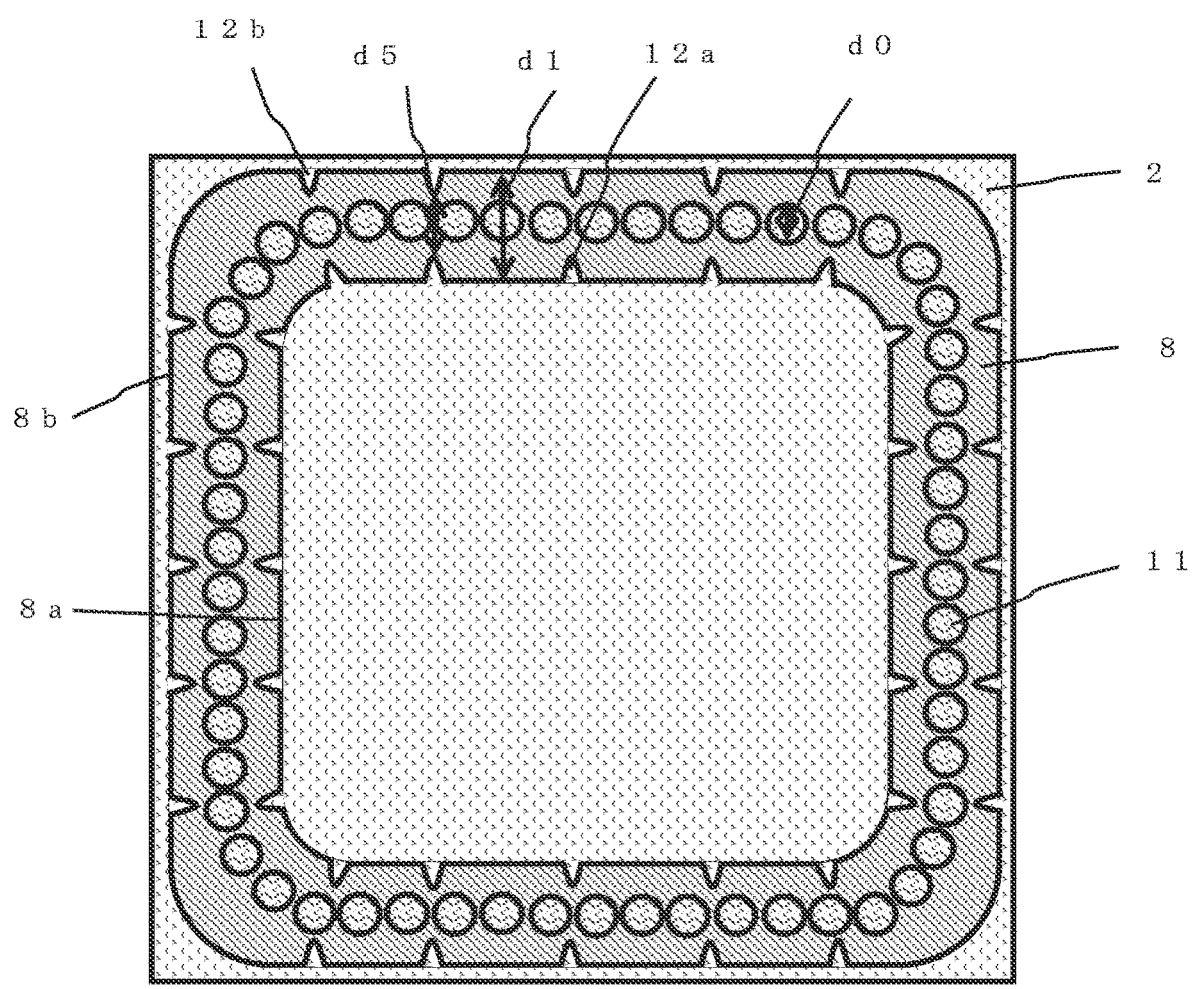

Next, as illustrated in FIG. 8A, a paste of metal bonding material 11 containing solder or a gold-tin alloy and the like, are applied as dots onto the metallization layer 8 of the lid portion 2 through use of a dispenser 14. At this time, as illustrated in FIG. 8B, the metal bonding material 11 is applied as a dot at an equal interval so as to separate from adjacent metal bonding material, and each of the metal bonding material 11 is formed into a substantially circular shape in plan view. Further, the diameter d0 of the metal bonding material 11 applied as a dot should be smaller than the width d1 of the metallization layer 8 and preferably be smaller than the end-to-end distance d5 between the notch portions 12a and 12b in the widthwise direction of the metallization layer 8. (Process 5)

Figure 9:
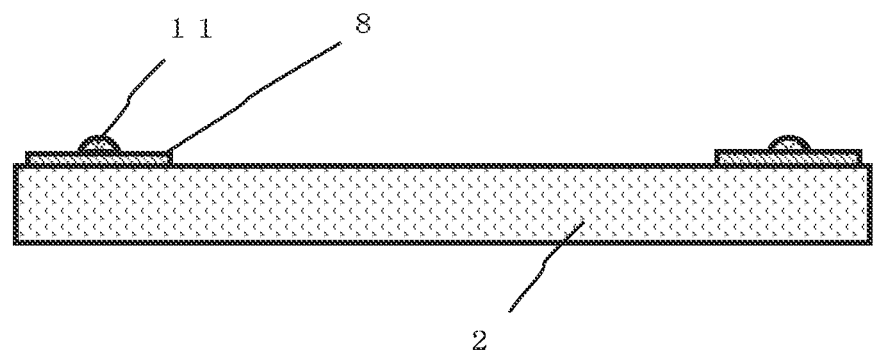
FIG. 9 is a view following FIG. 8A and FIG. 8B, for illustrating a manufacturing process of the optical sensor device according to the first embodiment of the present invention.

Next, as illustrated in FIG. 9, the metal bonding material 11 applied as a dot is pre-baked under a nitrogen atmosphere or a vacuum atmosphere. The pre-baking is a process of evaporating a solvent contained in the metal bonding material 11. The shape of the metal bonding material 11 in plan view is not substantially changed before and after the pre-baking, and only the height reduces. Through the execution of the pre-baking, a surface of the metallization layer 8 formed on glass or sapphire is thermally bonded to the metal bonding material 11 under a melting in progress while maintaining the shape into which the metal bonding material 11 is applied. Since the surface of the metal bonding material 11 that is not in contact with the metallization layer 8 is open, a void generated along with the melting easily evaporates. (Process 6) A manner in which the paste of metal bonding material 11 is applied is not limited to the application of the metal bonding material 11 as a dot, and may also be continuous application of the metal bonding material 11 or discontinuous application of the metal bonding material 11.

Figure 10:
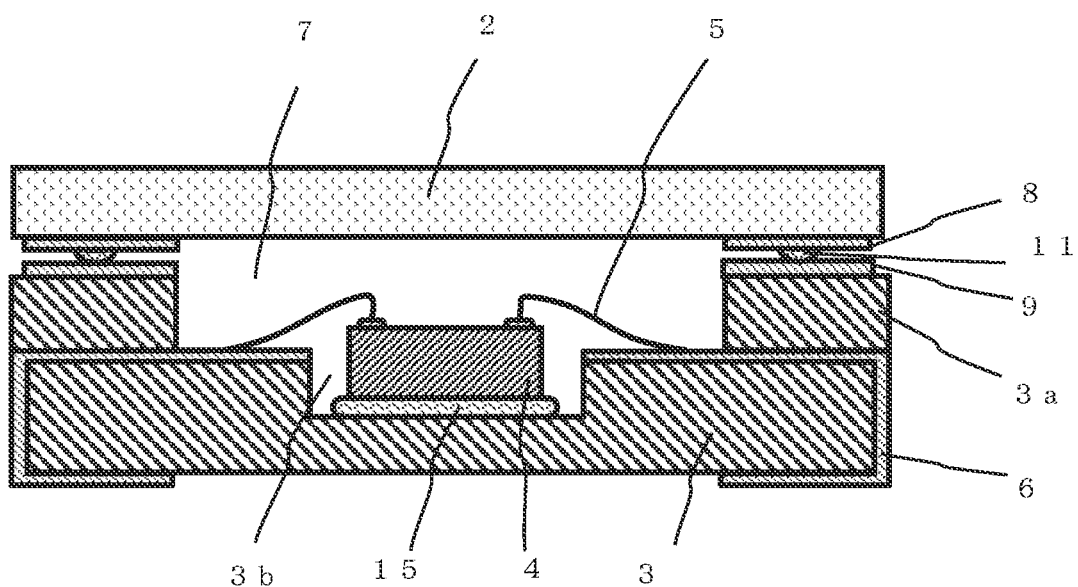
FIG. 10 is a view following FIG. 9, for illustrating a manufacturing process of the optical sensor device according to the first embodiment of the present invention.

Next, as illustrated in FIG. 10, the surface of the lid portion 2 having the metallization layer 8 to which the metal bonding material 11 is thermally bonded is stacked to face and the surface of the base portion 3 having the metallization layer 9. At this time, it is ensured that the notch portions 12a and 12b formed in the metallization layer 8 overlap the notch portions 13a and 13b formed in the metallization layer 9. (Process 7)

Next, the stacked lid portion 2 and base portion 3 are placed under a nitrogen atmosphere or a vacuum atmosphere, and final-baking at a temperature higher than the temperature of the pre-baking is performed while weight is applied from an upper surface of the lid portion 2 or a bottom surface of the base portion 3. In this process, binder, flux, and others evaporate from the metal bonding material 11, and only the metal component such as solder or a gold-tin alloy remains. As a result, the metal bonding layer 10 is formed. Through the formation of the metal bonding layer 10, the lid portion 2 is hermetically bonded to the base portion 3, and the hollow portion 7 in which the concentration of oxygen is zero or extremely low is formed inside the lid portion 2 and the base portion 3.

The optical sensor device 1 may be exposed to light having an extremely short wavelength, for example, UV-C, but the concentration of oxygen in the hollow portion 7 is zero or extremely low, and hence an amount of ozone generated by excitation of ultraviolet rays can be suppressed to an extremely low amount, or the ozone-free hollow portion 7 can be achieved. Thus, the deterioration of the optical semiconductor element 4 housed in the optical sensor device 1 can be suppressed. After the bonding is completed, the optical sensor device 1 is naturally cooled. (Process 8)

After the above-mentioned processes, the optical sensor device 1 illustrated in FIG. 1 is finished. Glass or sapphire used for the lid portion 2, alumina or aluminum nitride used for the base portion 3, and solder or a gold-tin alloy used for the metal bonding material 11 have different thermal expansion coefficients, and are affected by the stress due to the bonding. Accordingly, those materials are generally unsuitable for thermal bonding. However, by the use of the paste material as the metal bonding material 11, the application of the metal bonding material 11 as a separate dot and the pre-baking in advance for bonding the metal bonding material 11 and the metallization layer 8 formed on the lid portion 2, the stress generated on a bonding surface is smaller than the stress generated by a method in which simultaneous baking and bonding between the metallization layer 8 formed on the lid portion 2 and the metallization layer 9 formed on the base portion 3 are made. Thus, in the thermal bonding of materials having different thermal expansion coefficients execution of pre-baking is effective for preventing separation at an interface between a brittle material such as glass or sapphire and the metallization layer. As a result, the optical sensor device 1 housed in a hollow package that is highly airtight at the bonding surface can be provided.

Further, through the formation of the notch portions 12a and 12b in the metallization layer at fixed intervals, the stress due to the bonding of the lid portion 2 and the base portion 3 is dispersed into the regions sectioned by the notch portions 12a and 12b, and the stress corresponding to the area of each sectioned region is distributed to each region. Accordingly, the stress imposed on each region becomes smaller. As a result, the peeling at the interface between the brittle material and the metallization layer can be suppressed, and the optical sensor device 1 housed in a highly airtight hollow package can thus be provided.

Further, since the cross-sectional area of the metallization layer 8 formed on the lid portion 2 is set to be equal to or smaller than the cross-sectional area of the metallization layer 9 formed on the base portion 3, the peeling at the interface between the brittle material and the metallization layer can be suppressed and the optical sensor device 1 housed in a highly airtight hollow package can be provided.

As described above, according to at least one embodiment of the present invention a highly reliable optical sensor device housed in a highly airtight hollow package which does not deteriorate by the application of ultraviolet rays, and which is free from the risk of peeling between the lid portion and the base portion.

The optical sensor device according to at least one of the present invention is applicable not only to an industrial machine, a wearable terminal, and a household electrical appliance, but also to in-vehicle and outdoor uses.

What is claimed is:

1. An optical sensor device, comprising:
a base portion;
an optical semiconductor element placed on the base portion;
a lid portion stacked onto the base portion, the lid portion sealing the optical semiconductor element in a hollow portion;
a first metallization layer formed on a surface of the lid portion opposing the base portion;
a second metallization layer formed on a surface of the base portion is opposing the lid portion; and
a metal bonding layer bonding the first metallization layer to the second metallization layer,
the first metallization layer having a plurality of first notch portions.

2. The optical sensor device according to claim 1, wherein the plurality of first notch portions are arranged on an inner circumference and an outer circumference of the first metallization layer.

3. The optical sensor device according to claim 1, wherein the plurality of first notch portions are arranged only in a straight portion of the first metallization layer.

4. The optical sensor device according to claim 2, wherein the plurality of first notch portions are arranged only in a straight portion of the first metallization layer.

5. The optical sensor device according to claim 1, wherein the second metallization layer has a plurality of second notch portions.

6. The optical sensor device according to claim 2, wherein the second metallization layer has a plurality of second notch portions.

7. The optical sensor device according to claim 1, wherein the first metallization layer has a width equal to or smaller than a width of the second metallization layer.

8. The optical sensor device according to claim 2, wherein the first metallization layer has a width equal to or smaller than a width of the second metallization layer.

9. The optical sensor device according to claim 2, wherein the metal bonding layer is formed within the inner circumference and the outer circumference of the first metallization layer, and is formed within an inner circumference and an outer circumference of the second metallization layer.

10. The optical sensor device according to claim 4, wherein the metal bonding layer is formed within the inner circumference edge and the outer circumference edge of the first metallization layer, and is formed within an inner circumference edge and an outer circumference edge of the second metallization layer.

11. A method of manufacturing an optical sensor device, the method comprising:
preparing a base portion and a lid portion stackable onto the base portion;
forming a first metallization layer on a surface of the lid portion opposing the base portion;
forming a second metallization layer on a surface of the base portion opposing the lid portion;
placing the optical semiconductor element onto the base portion;
applying a metal bonding material onto the first metallization layer;
pre-baking the applied metal bonding material;
stacking the lid portion to the base portion through intermediation of the first metallization layer, the second metallization layer, and the pre-baked metal bonding material; and
final-baking the lid portion and the base portion at a temperature higher than a temperature in the pre-baking the applied metal bonding material while applying weight to one of the lid portion and the base portion to bond the lid portion to the base portion.

12. The method of manufacturing an optical sensor device according to claim 11, wherein the final-baking the lid portion and the base portion is performed under one of a nitrogen atmosphere and a vacuum atmosphere.

13. The method of manufacturing an optical sensor device according to claim 11, wherein the applying a metal bonding material includes applying an adjacent metal bonding material separated from the applied metal bonding material.

14. The method of manufacturing an optical sensor device according to claim 12, wherein the applying a metal bonding material includes applying an adjacent metal bonding material is separated from the applied metal bonding material.

15. The method of manufacturing an optical sensor device according to claim 11, wherein the applying a metal bonding material includes applying the metal bonding material in a region between an inner circumference and an outer circumference of the first metallization layer.

16. The method of manufacturing an optical sensor device according to claim 12, wherein the applying a metal bonding material includes applying the metal bonding material in a region between an inner circumference and an outer circumference of the first metallization layer.

* * * * *